United States Patent [19]
Kim et al.

[11] Patent Number: 5,734,611
[45] Date of Patent: Mar. 31, 1998

[54] FLASH MEMORY DEVICE

[75] Inventors: Dae Hyun Kim; Gyu Wan Kwon, both of Ichon, Rep. of Korea

[73] Assignee: Hyundai Electronics Industries Co., Ltd., Kyungki-do, Rep. of Korea

[21] Appl. No.: 695,402

[22] Filed: Aug. 12, 1996

[30] Foreign Application Priority Data

Aug. 10, 1995 [KR] Rep. of Korea .................. 1995-24666

[51] Int. Cl.$^6$ .................................................. G11C 13/00
[52] U.S. Cl. .................................. 365/185.33; 365/218
[58] Field of Search .......................... 365/185.33, 218

[56] References Cited

U.S. PATENT DOCUMENTS 5,270,979 12/1993 Harari et al. ........................... 365/218
5,623,442 4/1997 Gotou et al. ............................ 365/149

*Primary Examiner*—Terrell W. Fears
*Attorney, Agent, or Firm*—Fish & Richardson P.C.

[57] ABSTRACT

The present invention relates to a flash memory device and, more particularly, to a flash memory device which is constructed to prevent over-erase and stress of a cell by preventing re-erase of a sector, which was confirmed as a pass, at the time of the re-erase operation due to an occurrence of a fail sector by storing the address of the sector, which was confirmed as a pass, at the time of the erase operation of a multi sector, so as to improve the reliability of the product and the life of the cell.

The present invention generally applies to all the devices which utilize a multi sector erase performing algorithm among flash memory devices which utilize a stack memory cell.

6 Claims, 5 Drawing Sheets

FLASH MEMORY DEVICE

BACKGROUND OF INVENTION

1. Field of the Invention

The present invention relates to a flash memory device and, more particularly, to a flash memory device which is constructed to prevent over-erase and stress by preventing re-erase of a sector, which was confirmed as a pass, at the time of the re-erase operation due to an occurrence of a fail sector by storing the address of the sector, which was confirmed as a pass, at the time of the erase operation of a multi sector.

The present invention generally applies to all the devices which utilize a multi sector erase performing algorithm among flash memory devices which utilize a stack memory cell.

2. Information Disclosure Statement

Prior art multi sector erase performing algorithm circuit erases all the cells in a sector and thereafter verifies the result through erase confirmation. At that time, if any one cell in an arbitrarily selected sector is in a fail condition, all the sectors are re-erased. Cells in passed sectors are subject to unnecessary erase operation due to the failed sector. This causes over-erase and stress of a cell so that the reliability of the product is degraded and the life of a cell is reduced.

SUMMARY OF THE INVENTION

Therefore, an object of the present invention is to provide a flash memory device which can solve the above described disadvantages by cutting an erase voltage in a MUX circuit for a sector, which was confirmed as a pass, by latching the address of the sector, which was confirmed as a pass, at the time of confirmation after erase of each sector.

The present invention for achieving the above described object is characterized in that it comprises a detection circuit for confirmation of pass or fail at the time of confirmation of erase of a sector; a sector address counter circuit for selecting the sector; a sector address generating circuit having the output signals of the detection circuit and sector address counter circuit as an input; a sector address decoder circuit having the output signal of the sector address generating circuit as an input; and a MUX circuit having the output signal of the address decoder circuit of the passed sector as an input.

BRIEF DESCRIPTION OF THE DRAWINGS

For fuller understanding of the nature and objects of the invention, reference should be had to the following detailed description taken in conjunction with the accompanying drawings in which.

DETAILED DESCRIPTION OF THE DRAWINGS

A detailed description of an embodiment of the present invention is given below with reference to the accompanying drawings.

Figure 1:
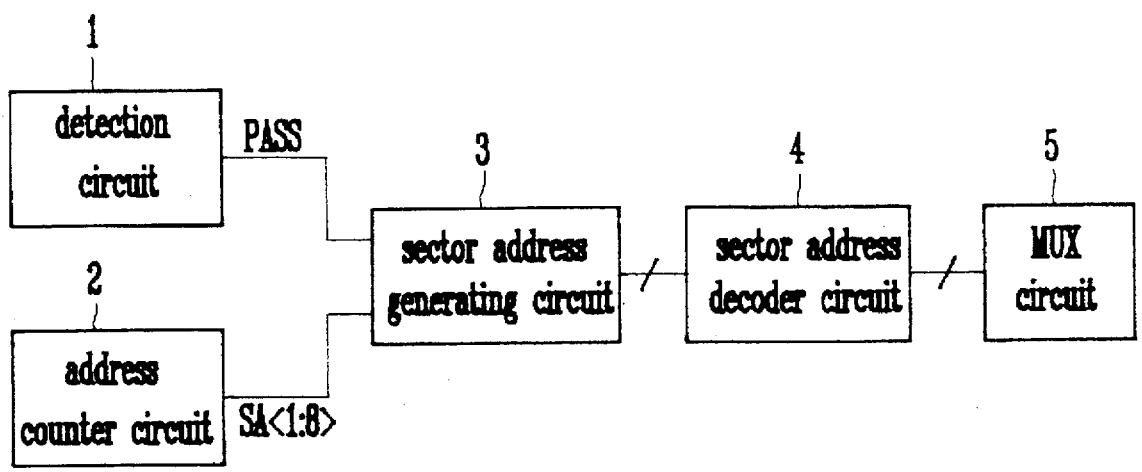
FIG. 1 is a block diagram of a flash memory device according to the present invention.

FIG. 1 is a block diagram of a flash memory device according to the present invention, where the device consists of a Pass/Fail detection circuit 1 for confirmation of pass or fail at the time of confirmation of erase of a sector; a sector address counter circuit 2 for selecting said sector; a sector address generating circuit 3 having output signals of said detection circuit 1 and sector address counter circuit 2 as input; a sector address decoder circuit 4 having output signal of said sector address generating circuit 3 as input; and a MUX circuit 5 having output signal of said address decoder circuit 4 of said passed sector as input. In case a sector is confirmed as a pass at the time of confirmation of a sector, an output signal of the detection circuit 1 is generated as outputs high potential. The sector address counter circuit 2 sequentially outputs the sector address for performing the erase confirmation. The sector address generating circuit 3 generates the passed sector address with the output signals of the detection circuit 1 and sector address counter circuit 2 as input. The sector address decoder circuit 4 supplies to the MUX circuit 5 the address generated by the sector address generating circuit 3. The MUX circuit 5 disables the passed sector inputted from the sector address generating circuit 3 so that it is not re-erased when the sector is re-erased due to the occurrence of a failed sector.

Figure 2A:
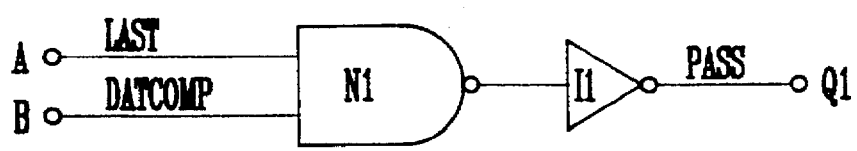
FIGS. 2A to 2E are detailed circuit drawings of FIG. 1.

FIG. 2A is a detection circuit drawing for confirmation of the pass or fail of the sector at the time of confirmation of erase of multi sectors, where the circuit consists of a 2-input NAND gate N1 and an inverter gate I1 having the output of the NAND gate N1 as an input. In the case where all the sectors (1 through 8) are outputted as the passed one, a "High" signal is inputted to one input terminal A of the NAND gate N1 when the first sector through the last sector are inputted and a "High" signal is inputted to the other input terminal B when the data of each sector is confirmed as pass when the sectors (1 through 8) are inputted. At that time, the output of the NAND gate N1 becomes a "Low" state. The output of the NAND gate N1 is outputted as a "High" state through an inverter gate I1.

Figure 2B:
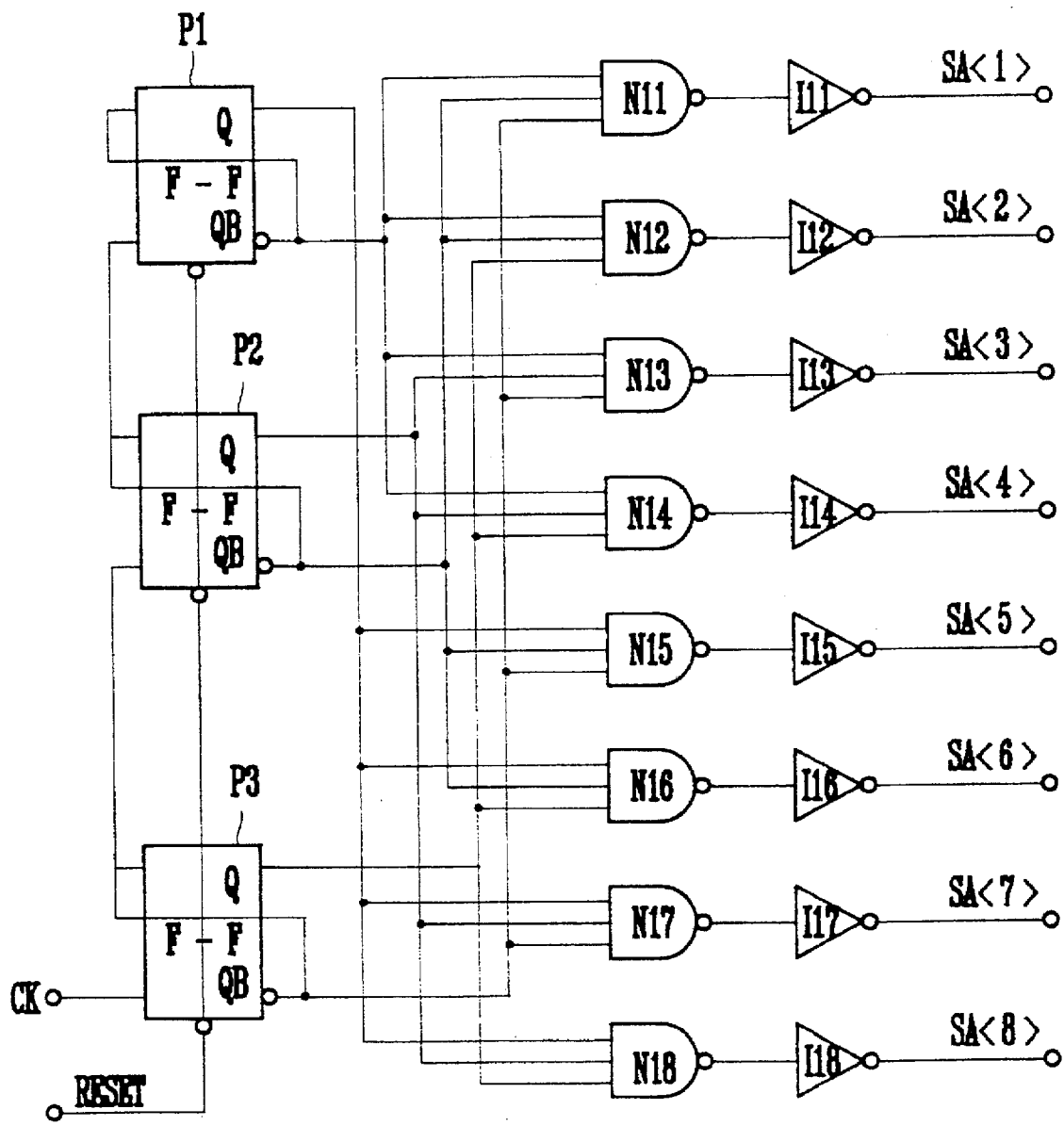

FIG. 2B shows a sector address counter, where the counter consists of a plurality of flip-flops P1 through P3 having a clock signal CK as an input; a plurality of 3-input NAND gates N11 through N18 having output signal of said flip-flops P1 through P3 as an input; and a plurality of inverter gates I11 through I18, having an output signal of said 3-input NAND gate N11 through N18 as input. The input of the 3-input NAND gate N11 through N18 is determined according to the inverted an output signal Q and QB and output signal of the first through the third flip-flop P1 thorough P3 having the clock signal as an input. The sector address counter 2 sequentially outputs the sector addresses SA1 through SA8 through a plurality of inverter gates I11 through I18 having the an output signal of the 3-input NAND gate N11 through N18 as input.

Figure 2C:
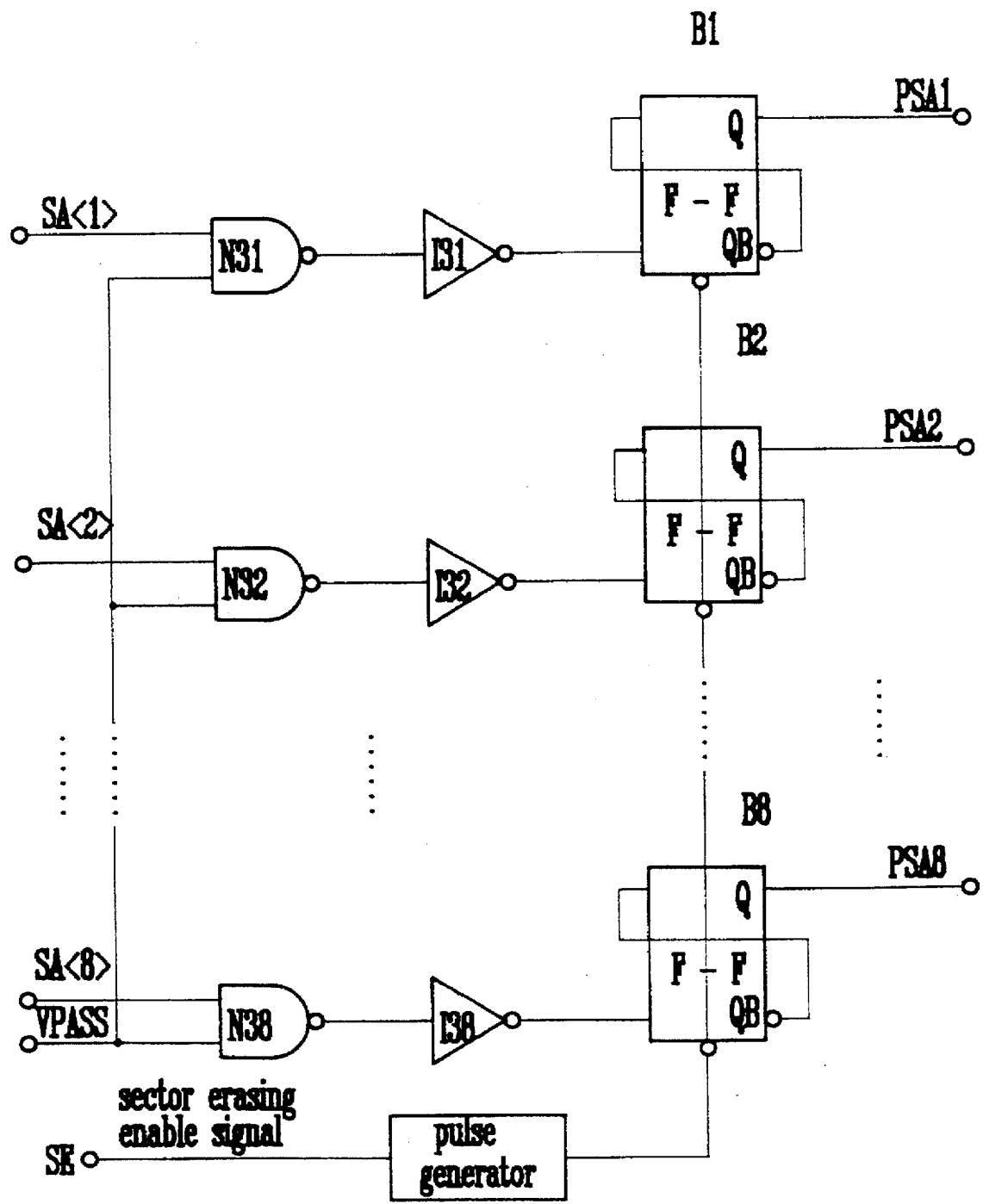

FIG. 2C shows a sector address generating circuit, where the circuit consists of a plurality of NAND gates N31 through N38 having two inputs; a plurality of flip-flops B1 through B8 having outputs of said plurality of NAND gates N31 through N38 through a plurality of inverter gates I31 through I38 as input; and a pulse generator 6 having an enable signal SE for erasing said sector as input, and for driving said plurality of flip-flops B1 through B8. The sector addresses SA1 through SA8 are inputted to one input terminal of each NAND gate N31 through N38. To the other input terminal of the NAND gates N31 through N38 is commonly inputted a VPASS representing the pass. The output of the NAND gate N31 through N38 is inputted to the flip-flops B1 through B8 through inverter gates I31 through I38. A pulse signal is outputted from the pulse generator 6 having as an input the enable signal SE for erasing the sector. Therefore, the flip-flip B1 through B8 generates the normally passed sector addresses PSA1 through PSA8 according to the pulse signal outputted from the pulse generator 6.

Figure 2D:
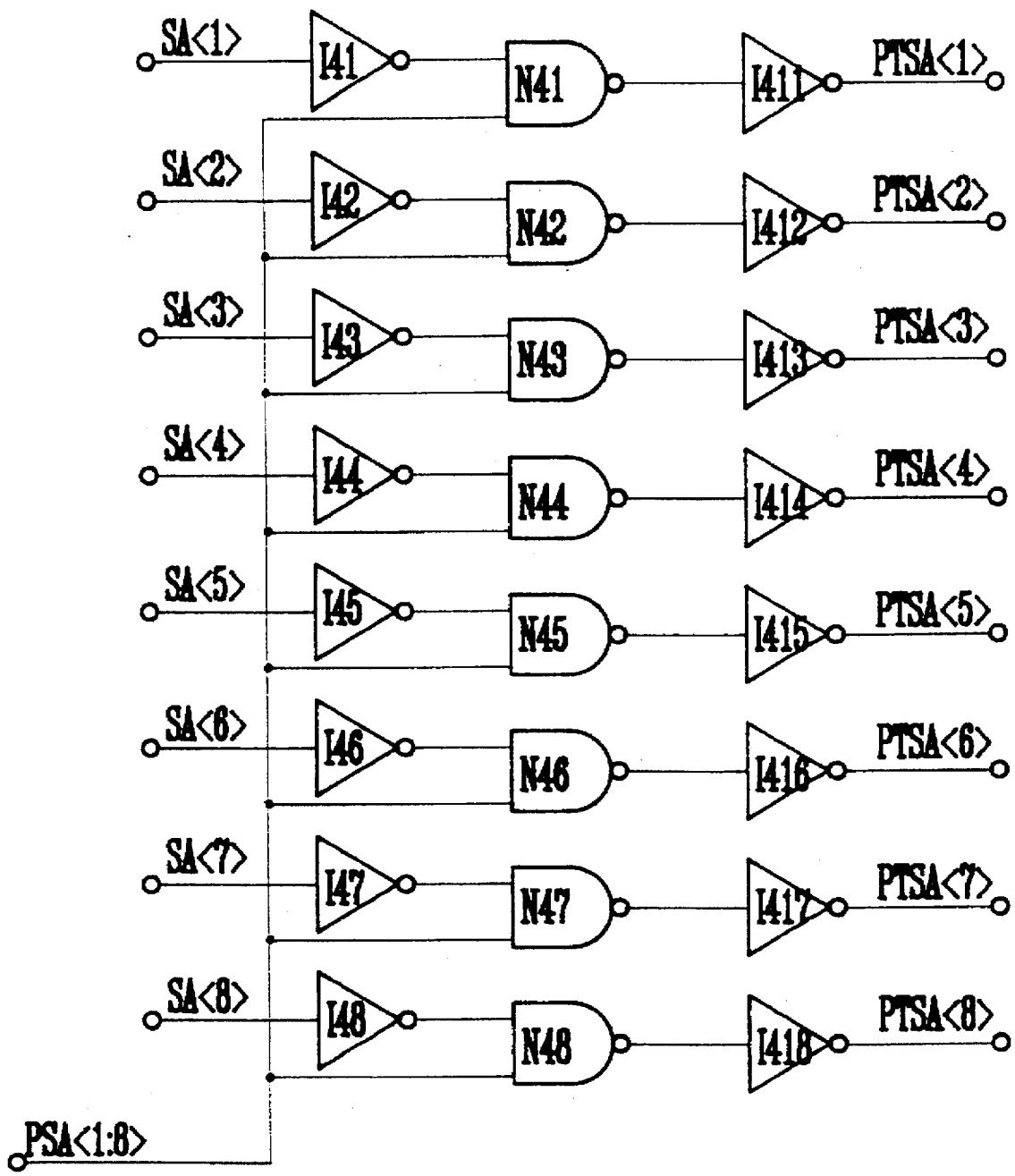

FIG. 2D shows a sector address decoder, where the decoder consists of a plurality of 2-input NAND gates N41 through N48 having as one input said plurality of sector addresses SA1 through SA8 through a plurality of inverter gates I41 through I48 and as the other input said plurality of protected sector addresses PSA1 through PSA8; and a plurality of inverter gates I411 through I418 having output signal of said 2-input NAND gates N41 through N48 as input. The output of the sector address decoder generates the protected sector address signals PTSA1 through PTSA8 according to the plurality of sector addresses SA1 through SA8 and the plurality of protected sector addresses PSA1 through PSA8. The protected sector address signal is enabled when it is "Low".

Figure 2E:
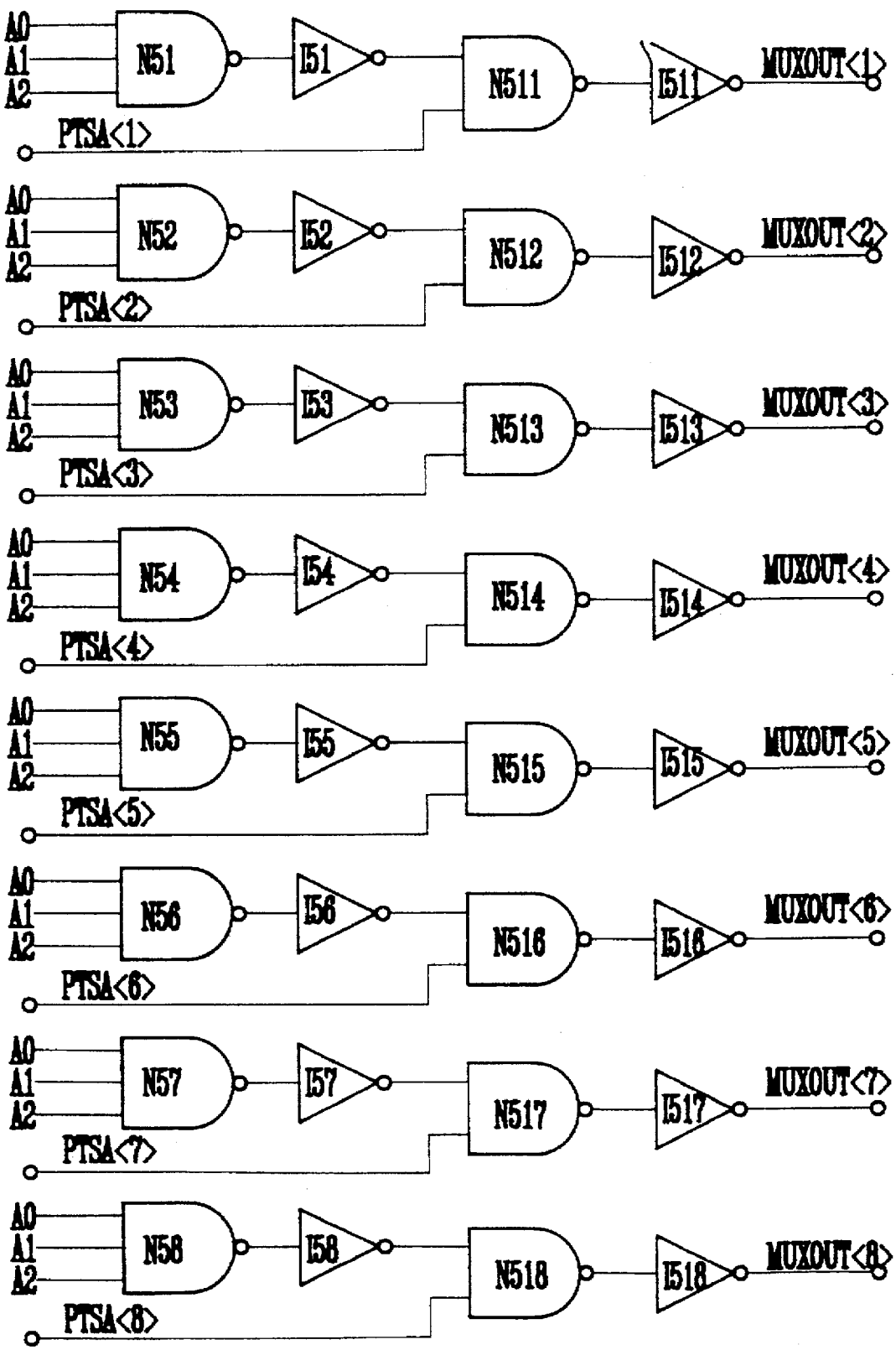

FIG. 2E shows a MUX circuit, where the circuit consists of a plurality of 3-input NAND gates N51 through N58 having a plurality of addresses A0 through A2 outputted from an address buffer (not shown) as input; a plurality of 2-input NAND gates N511 through N518 having as one input said plurality of 3-input NAND gates N51 through N58 through a plurality of inverter gates I51 through I58 and having as the other input said plurality of protected sector addresses PTSA1 through PTSA8; and a plurality of inverter gates I511 through I518 having the output signal of said 2-input NAND gates N511 through N518 as input. The plurality of 3-input NAND gates N51 through N58 are decoders of addresses A0 through A2 and selects the address by decoding first through eighth sectors. Assuming that the first sector address, for example, is selected, the addresses A0 through A2 are all in "Low" state. Accordingly, the output signal of the 3-input NAND gate N51 becomes a "Low" state. At this time, if the protected sector address PTSA1 is a "Low" state, the first output MUXOUT 1 of the MUX circuit becomes "High" state so as to disable the first sector not to be erased. By controlling the second through eighth output MUXOUT 2 through MUXOUT 8 of the MUX circuit in the above described way, the second through eighth sectors are prevented from being re-erased.

As described above, the present invention prevents over-erase and stress by preventing re-erase of a sector, which was confirmed as a pass, at the time of the re-erase operation due to occurrence of a failed sector by storing the address of a sector, which was confirmed as a pass, at the time of erase operation of multi sector, so as to improve the reliability of the product and the life of the cell.

What is claimed is:

1. A flash memory device, comprising:

a detection circuit for confirmation of a pass or fail signal at the time of confirmation of erase of a sector;

a sector address counter circuit for selecting said sector;

a sector address generating circuit having the output signals of said detection circuit and sector address counter circuit as an input;

a sector address decoder circuit having the output signal of said sector address generating circuit as an input; and a MUX circuit having the output signal of said address decoder circuit of said passed sector as an input.

2. The device of claim 1, wherein said detection circuit consists of a 2-input NAND gate and an inverter gate having the output of said NAND gate as an input.

3. The device of claim 1, wherein said sector address counter consists of:

a plurality of flip-flops having a clock signal as an input;

a plurality of 3-input NAND gates having the output signal of said flip-flops as an input; and a plurality of inverter gates having the output signal of said 3-input NAND gate as an input.

4. The device of claim 1, wherein said sector address generating circuit consists of:

a plurality of NAND gates having two inputs;

a plurality of flip-flops having outputs of said plurality of NAND gates through a plurality of inverter gates as input; and a pulse generator having an enable signal for erasing said sector as input, and for driving said plurality of flip-flops.

5. The device of claim 1, wherein said sector address decoder consists of:

a plurality of 2-input NAND gates having as one input said plurality of sector addresses through a plurality of inverter gate and as the other input said plurality of protected sector addresses; and a plurality of inverter gate having output signal of said 2-input NAND gates as input.

6. The device of claim 1, wherein said MUX circuit consists of:

a plurality of 3-input NAND gates having a plurality of addresses as input;

a plurality of 2-input NAND gates having as one input said plurality of 3-input NAND gates through a plurality of inverter gates and having as the other input said plurality of protected sector addresses; and a plurality of inverter gates having the output of said 2-input NAND gates as input.

* * * * *